United States Patent
Wu et al.

[11] Patent Number: 6,146,948
[45] Date of Patent: Nov. 14, 2000

[54] METHOD FOR MANUFACTURING A THIN OXIDE FOR USE IN SEMICONDUCTOR INTEGRATED CIRCUITS

[75] Inventors: Wei Edwin Wu; Hsing-Huang Tseng; Phillip Earl Crabtree; Yeong-Jyh Tom Lii, all of Austin, Tex.

[73] Assignee: Motorola Inc., Schaumburg, Ill.

[21] Appl. No.: 08/868,331

[22] Filed: Jun. 3, 1997

[51] Int. Cl.[7] .................. H01L 21/336; H01L 21/302; H01L 21/461

[52] U.S. Cl. ................. 438/275; 438/279; 438/287; 438/706; 438/714; 438/735; 438/770; 438/787; 438/798

[58] Field of Search .................. 438/275, 279, 438/287, 706, 714, 719, 723, 735, 737, 770, 766, 773, 787, 798

[56] References Cited

U.S. PATENT DOCUMENTS

| | | | |
|---|---|---|---|
| 4,411,734 | 10/1983 | Maa | 438/655 |
| 5,371,026 | 12/1994 | Hayden et al. | 437/41 |
| 5,716,864 | 2/1998 | Abe | 438/258 |
| 5,723,355 | 3/1998 | Chang et al. | 438/275 |
| 5,762,813 | 6/1998 | Takiyama et al. | 216/67 |
| 5,763,922 | 6/1998 | Chau | 257/371 |
| 5,766,998 | 6/1998 | Tseng | 438/291 |
| 5,811,336 | 9/1998 | Kasai | 438/271 |
| 5,834,352 | 11/1998 | Choi | 438/275 |
| 5,960,274 | 9/1999 | Mehta | 438/211 |

OTHER PUBLICATIONS

"The Study on the Influence of Gas Chemistry and Ion Energy for Contact Resistance," K. Hashimi, D. Matsunaga, et al. 1995 Dry Process Symposium, pp. 207–212.

"Impace of Reactive Ion Etching Induced Carbon Contamination on Oxidation of Silicon," M. Tsuchiaki, R. J. Kvitek, et al. J. Electrochem. Soc., vol. 143, No. 7, Jul. 1996. pp. 2378–2387.

Primary Examiner—Carl Whitehead, Jr.
Assistant Examiner—James Park
Attorney, Agent, or Firm—Keith E. Witek

[57] ABSTRACT

A method for forming a gate dielectric having different thickness begins by providing a substrate (12). A sacrificial oxide (14) is formed overlying the substrate (12). A first portion (11) of the sacrificial oxide (14) is exposed to a carbon-containing plasma environment (20). This carbon-containing plasma environment (20) forms a carbon-containing layer (24) within the region (11). After forming this region (24), a wet etch chemistry (22) is used to remove remaining portions of the sacrificial oxide (14) without forming a layer (24) in the region (13). Furnace oxidation is then used to form regions (26a) and (26b) wherein the growth of region (26a) has been retarded by the presence of the region (24). Therefore, the regions (26a) and (26b) are differing in thickness and can be used to make different transistors having different current gains.

30 Claims, 2 Drawing Sheets

METHOD FOR MANUFACTURING A THIN OXIDE FOR USE IN SEMICONDUCTOR INTEGRATED CIRCUITS

FIELD OF THE INVENTION

The present invention relates generally to semiconductor manufacturing, and more particularly to, forming a thin oxide for use in semiconductor integrated circuits (ICs).

BACKGROUND OF THE INVENTION

In the integrated circuit (IC) industry, it is advantageous to form extremely thin gate oxide layers. One method used by the industry to form thin gate oxides is to decrease oxidation time and/or decrease the gate oxide processing temperature. Any time oxidation time or temperature is reduced, the electrical properties of the gate oxide are effected and controllability of the process is compromised. Therefore, an alternative solution to altering temperature or time of exposure is desired.

In addition, it is advantageous in the integrated circuit industry to form electrical devices that have gate oxides with differing thickness. Prior art methods for forming two devices which have gate oxides with different thickness are extremely complex, thereby resulting in increased process-induced damage and defects.

The prior art has attempted to grow thin oxides by introducing nitrogen into a surface of a substrate. Nitrogen incorporated into a substrate via thermal diffusion or ion implantation will result in a retardation of oxide growth whereby a thinner oxide is formed. However, implantation and thermal diffusion of nitrogen into a substrate surface requires additional processing. The incorporation of nitrogen is not insitu and may result in non-uniform threshold voltage properties of MOS transistors if the nitrogen is not uniformly distributed across the active area of the substrate or if nitrogen is incorporated into the substrate in too large of a concentration. Therefore, the exsitu incorporation of the nitrogen into a substrate in order to retard oxide growth is not, by itself, optimal.

The integrated circuit industry has formed ICs containing two types of transistors with different oxide thickness in order to result in current gain differential devices as taught in U.S. Pat. No. 5,371,026. In these prior art techniques, extremely complex processing technology is utilized to result in two transistors having different electrical characteristics due to different gate oxide properties/thickness. The use of these complex processes is not advantageous due to an impact upon integrated circuit (IC) yield. Therefore, an improved process for forming a single gate oxide having different thickness is desired in the integrated circuit art where one of the oxide thickness is very thin and well-controlled.

In addition, the integrated circuit (IC) industry has studied carbon-based plasma effects on contact resistance and other substrate properties. This study is reported in a paper by Hashimi and titled "The Study on the Influence of Gas Chemistry and Ion Energy for Contact Resistance". In this paper, Hashimi states that carbon incorporation into a substrate due to carbon-based plasma etching is disadvantageous from a contact resistance perspective. Therefore, the integrated circuit (IC) industry, through Hashimi, has suggested that carbon-based oxide-etching plasmas be replaced with non-carbon-based plasmas to avoid increased contact resistance to the substrate. Therefore, the integrated circuit (IC) industry is teaching away from the use of carbon incorporation into a substrate through the use of carbon plasma etch chemistries.

A need exists for a method for forming a single gate oxide layer which has both a thin oxide portion and a thicker oxide portion whereby yield is not impacted, threshold voltages are stable, and integrated circuit processing is not complicated.

Figure 1:
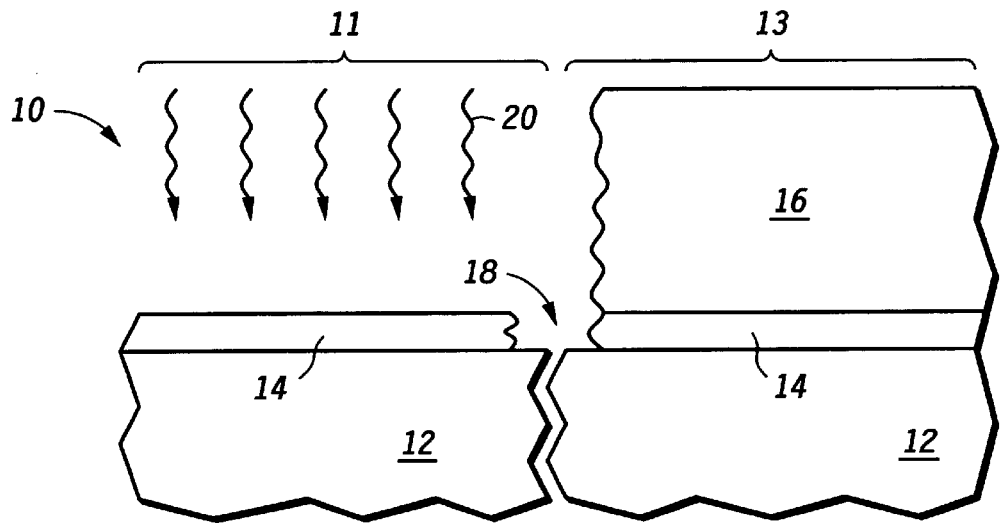
FIG. 1 illustrates, in a cross-sectional diagram, a method for plasma etching a sacrificial oxide from a first portion of a substrate in accordance with the present invention.

It will be appreciated that for simplicity and clarity of illustration, elements illustrated in the Figures have not necessarily been drawn to scale. For example, the dimensions of some of the elements are exaggerated relative to other elements for clarity. Further, where considered appropriate, reference numerals have been repeated among the Figures to indicate corresponding or analogous elements.

DESCRIPTION OF A PREFERRED EMBODIMENT

Generally, the present invention is a method for forming a thin gate oxide region which can be: (1) formed insitu with a thicker gate oxide region for use in manufacturing two different transistors having two different current gains; or (2) formed exsitu to all other oxide processing as a stand-alone thin oxide. The gate oxide, which has two different thickness, is formed by using novel dry and wet etch processing. In order to form the two different oxide thickness in one oxide growth step, a first portion of the substrate is exposed to a carbon-based plasma etch environment which forms a thin carbon-containing region within the substrate.

A second portion of the semiconductor substrate is exposed to a wet etch chemistry which does not form a carbon containing layer within the substrate. A furnace oxide process is then used to grow an oxide layer on the surface of the substrate whereby the carbon-containing layer will retard oxide growth so that an oxide formed over the carbon-containing layer will be thinner than the oxide formed over the wet etched region of the substrate.

By using the carbon incorporation mechanism discussed herein, ultra-thin oxides can be formed in isolation or can be formed insitu with thicker gate oxide portions for use in forming two different MOS transistors with different current gains. This process for forming thin gate oxides is greatly improved over prior art methods. For example, two transistors having differing gate oxide thickness whereby the current gain of the devices are different can be formed without adversely impacting yield and while maintaining low processing costs. Unlike the implantation of nitrogen, the insitu process taught herein does not require additional processing, adverse heat cycles, and the threshold voltage stability will not be substantially effected.

The present invention can be further understood with reference to FIGS. 1–5.

FIG. 1 illustrates a semiconductor device 10. Semiconductor device 10 contains a substrate 12. In a preferred form, the substrate 12 is any silicon-based substrate such as a silicon wafer, a silicon germanium wafer, a silicon on insulator (SOI) wafer, a bipolar wafer formed via epitaxial growth, or any like semiconductor wafer.

After providing the semiconductor substrate 12, a sacrificial oxide 14 is formed over the surface of the substrate 12. The layer 14 is preferably a furnace-formed silicon dioxide ($SiO_2$) layer which is formed in a furnace controlled at a temperature between 950° C. and 1050° C. The layer 14 is typically formed by exposure to an $°2$ furnace environment at an elevated temperature. A typical range of thickness for the sacrificial layer 14 is 200 angstroms to 600 angstroms.

FIG. 1 illustrates a first substrate portion 11 and a second substrate portion 13. The first portion 11 and the second portion 13 will be used to form two different transistors having different current gains as described herein (see FIG. 5). The break 18 which separates the regions 11 and 13 in FIG. 1 is present in FIG. 1 to indicate that the two devices formed in the portions 11 and 13 may be directly adjacent one another (and even coupled to one another via a doped diffusion region within the substrate 12) or may be transistors separated from each other by field oxide. In fact, the devices in the regions 11 and 13 may be separated by hundreds or thousands of microns in a final integrated circuit (IC) design.

FIG. 1 illustrates that a photoresist layer 16 is spin coated on the sacrificial oxide 14 and lithographic processed to form a photoresist mask region 16 in FIG. 1. The photoresist is lithographically exposed and developed to form mask region 16 so that only the sacrificial oxide 14 which lies within the second portion 13 is protected by photoresist. Therefore, no photoresist overlies the sacrificial oxide 14 which lies within the portion 11. Therefore, this sacrificial oxide portion 14 within region 11 and unprotected by the mask layer 16 can be readily exposed to a plasma environment 20 as illustrated in FIG. 1.

Figure 2:
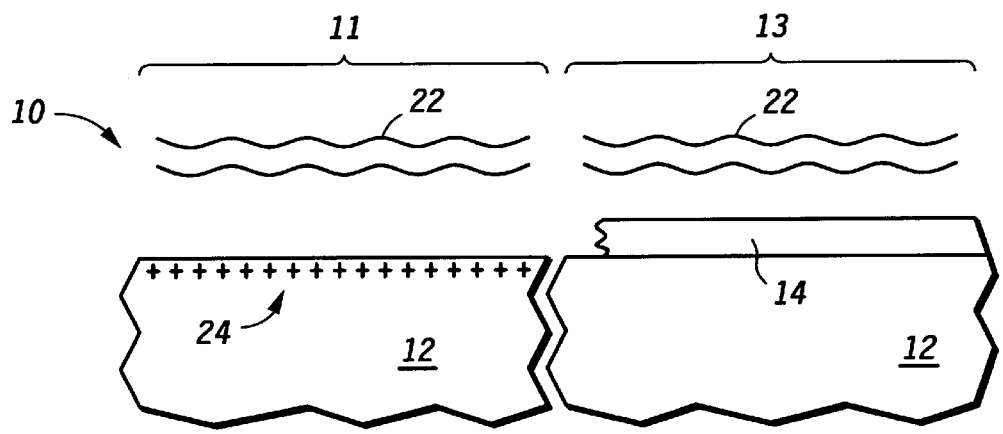
FIG. 2 illustrates, in a cross-sectional diagram, a method for etching a second portion of a sacrificial oxide layer using a wet chemistry in accordance with the present invention.

The plasma environment 20 illustrated in FIG. 1 is any plasma chemistry which etches oxide and is carbon-based. In particular, the plasma environment 20 contains one or more of $CHF_3$ or $CF_4$, and an inert argon (Ar) flow. This plasma environment will etch the sacrificial oxide 14 located within region 11 resulting in a semiconductor structure as illustrated in FIG. 2. It is important to note that exposure to the plasma 20, which contains carbon, will result in carbon incorporation into the surface of the substrate 12 which lies within region 11. This carbon-containing region 24 which is formed within region 11 as a byproduct of plasma exposure is illustrated in FIG. 2.

The depth profile and depth distance of the carbon region 24 as well as the density of the carbon atoms within region 24 is a function of plasma exposure time and plasma power. Therefore, the plasma power and the plasma over-etch exposure time can be adjusted by an engineer to control the depth and depth profile of region 24 as well as the surface concentration of carbon within the region 24. This type of control for region 24 is important since the depth, depth profile, and concentration of carbon in the region 24 will affect the degree to which oxidation retardation will occur in subsequent processing discussed herein (see FIG. 4). More carbon located at the surface of the substrate 12 will retard oxide growth to a greater degree. During thermal or furnace oxide growth, portions of the semiconductor substrate (e.g., Si atoms) and carbon atoms from region 24 are consumed by the oxidation process to form the oxide layer (e.g., $SiO_2$). With each incremental consumption of substrate material, a different carbon concentration is faced by the oxidation process, thereby resulting in incrementally different oxide retardation as substrate material is consumed. Therefore, the carbon profile of the carbon-containing layer 24 measured into the depth of the substrate 12 is important in order to control oxidation retardation over time as the $SiO_2$ is being progressively grown. A linear profile or step function profile will retard growth uniformly over time. A Gaussian tail distribution of carbon into the substrate will retard oxide growth more at the beginning of oxidation process and to a lesser extent as the substrate is consumed through oxidation.

In addition to forming the carbon region 24 of FIG. 2, nitrogen (atomic N) can be incorporated into the region 24 along with carbon by providing $N_2$ gas into the plasma environment 20 in addition to the inert carrier argon (Ar) gas or in lieu of the argon (Ar) gas in FIG. 1. When incorporating nitrogen into the plasma 20 of FIG. 1, nitrogen will also be incorporated into the region 24 along with the carbon from the plasma environment 20 during sacrificial oxide etching. Therefore, the synergistic combination of nitrogen and carbon in the region 24 will result in further retardation of oxide growth with the region 11, thereby creating a larger disparity in thickness between thin and thick oxide portions which are subsequently formed via FIG. 4 (see oxide portions 26a and 26b). The combination of nitrogen and carbon into the region 24 may result in the nitrogen having no effect at all on the threshold voltages as is the case in the prior art. In addition to incorporating nitrogen into the plasma 20, a separate exsitu nitrogen incorporation step can be utilized after substrate exposure to the plasma 20 via FIG. 1. In other words, nitrogen ion implantation into the region 24 can occur before the processing illustrated in FIG. 2, but after the processing illustrated in FIG. 1. In addition, one of either $NH_3$, NO, or $N_2O$ exposure may occur between the processing illustrated via FIGS. 1 and 2 to further incorporate nitrogen into the region 24 of FIG. 2 for further oxidation retardation.

FIG. 2 illustrates that the substrate 12 along with the remaining sacrificial oxide layer 14 which lies within region 13 are placed into a wet etch environment 22. In a preferred form, the wet etch environment 22 contains buffered oxide etch (BOE) chemicals or a hydrofluoride (HF) acid bath which is diluted with $H_2O$. This wet etch chemistry 22 will remove the sacrificial oxide portion 14 lying within the region 13 without adversely effecting the carbon-containing region 24 within the region 11 of FIG. 2. The carbon-containing layer 24 is not affected since the wet etch chemistry 22 typically has an extremely high selectivity to silicon materials (e.g., greater than 100:1).

Figure 3:
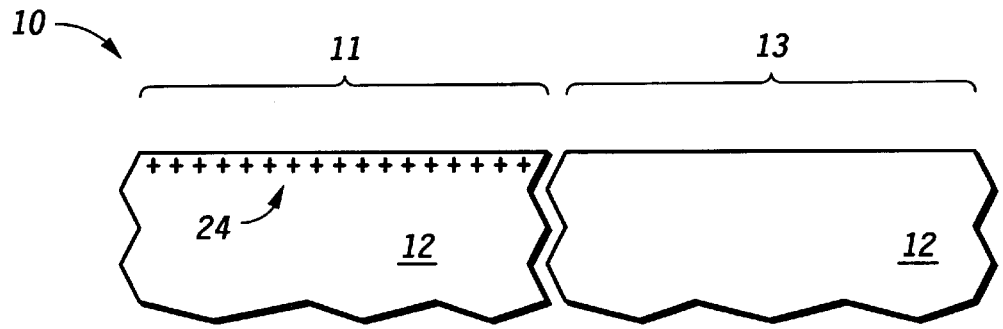
FIGS. 3–4 illustrate, in cross-sectional diagrams, a furnace oxide growth cycle which is used to grow an oxide having two different thickness in accordance with the present invention.

FIG. 3 illustrates the resulting substrate surface after all of the etch processing previously discussed with respect to FIGS. 1 and 2. FIG. 3 illustrates the region 11 and the region 13. FIG. 3 specifically illustrates that the region 11 contains a substrate portion 12 whereby a carbon-containing layer 24 is resident near a top surface of the substrate 12. As previously discussed, this region 24 can be a composite nitrogen/carbon-containing layer 24 using the nitrogen and carbon processing details discussed above via FIGS. 1 and 2. While the region 11 contains the layer 24, the photoresist masking and wet etch processing of region 13 results in a substrate portion 13 which is free from carbon or nitrogen incorporation.

Figure 4:
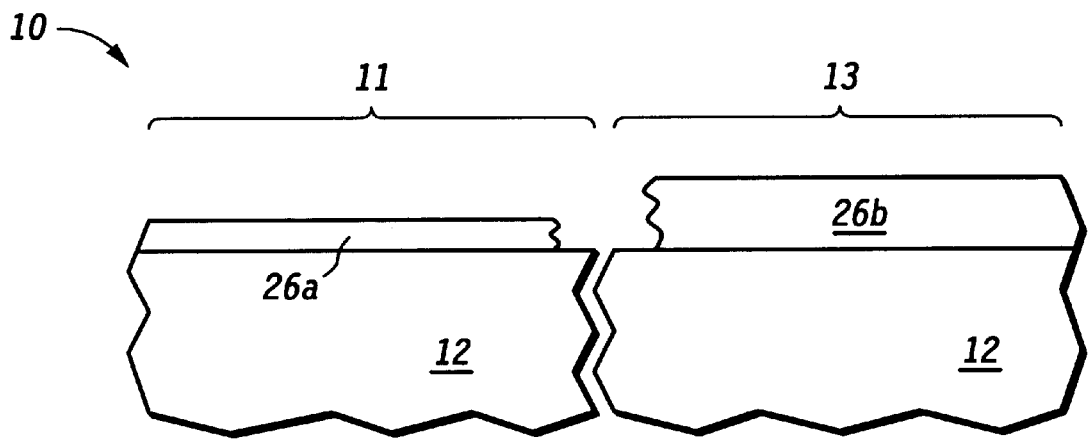

FIG. 4 illustrates that the substrate 12, which contains the carbon containing layer 24, is now exposed to a furnace or thermal oxidation environment. In a preferred form, the substrate 12 of FIG. 3 is exposed to an $O_2$ environment which is heated to a temperature between 700° C. and 1050° C. for a time period of roughly 5 minutes to one hour. As illustrated in FIG. 4, the resulting exposure to the oxidizing environment results in a single oxide layer formed having a first oxide portion 26a and second oxide portion 26b. Due to the presence of the carbon-containing layer 24 of FIG. 3, the oxide portion 26a is an oxide portion having a thickness substantially less than the oxide portion 26b, even though both portions 26a and 26b were grown insitu under the same environmental conditions. Depending upon the nitrogen/carbon composition, carbon depth, carbon profile, and carbon density of the layer 24 in FIG. 3 as previously discussed, the thickness of region 26b can be 1.5 to 3 times as thick as the thickness of region 26a. Typical thickness are such that layer 26a will be between 40 angstroms and 110 Angstroms while the layer 26b will be between 60–300 Angstroms with layer 26b being thicker than layer 26a.

Figure 5:
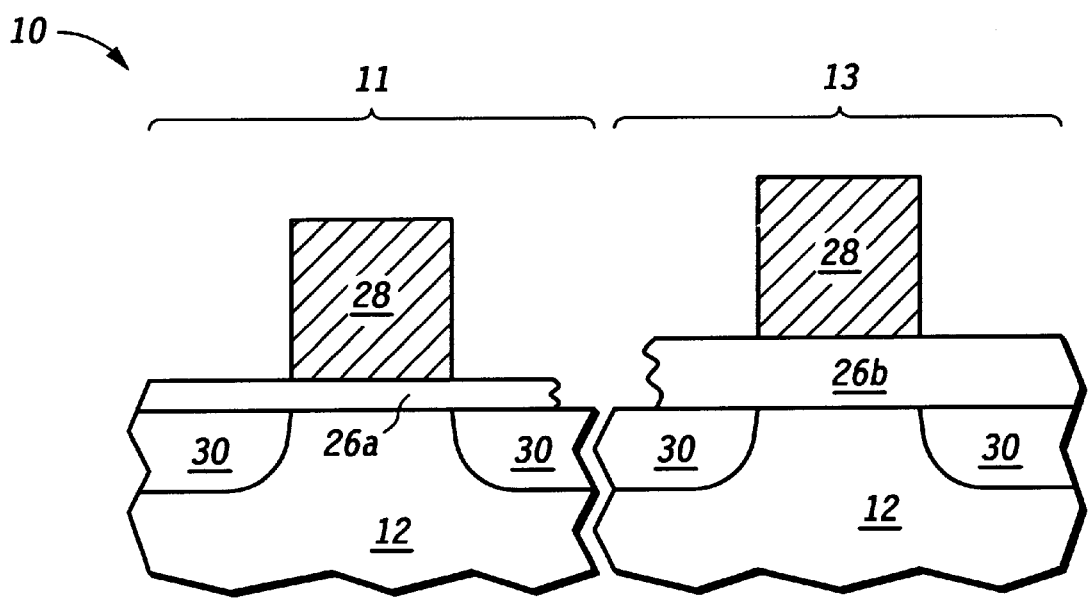
FIG. 5 illustrates, in a cross-sectional diagram, forming two different transistors wherein each transistors has a different gate oxide thickness whereby two different transistors having different electrical characteristics are formed in accordance with the present invention.

FIG. 5 illustrates that a first MOS transistor is formed in region 11 while a second MOS transistor is formed in region 13.

While FIG. 5 illustrates MOS transistors, it is important to note that any type of electrical device can be formed in regions 11 and 13 using the oxide processing taught herein. The MOS transistors of FIG. 5 are formed by depositing a polysilicon layer and etching this polysilicon layer to form gate electrodes 28 as illustrated in FIG. 5. Source and drain regions 30 are then formed within the substrate 22 whereby these source/drain regions can be lightly doped drain (LDD) regions, elevated source/drain regions, or a like source and drain region structure. As illustrated in FIG. 5, the transistor within region 11 will have a gate oxide thickness from layer 26a which is substantially less than the thickness of layer 26(b) which is the gate oxide of the transistor formed in region 13. Therefore, the two transistors illustrated in FIG. 5 will have different current gain due to the different gate oxide thickness. Specifically, the transistor with the thinner gate oxide layer will have a higher current gain.

The formation of the different gate oxide thickness for different transistors in an integrated circuit (IC) design is highly advantageous for many reasons. In one form, the devices of FIG. 5 can be used to form non-volatile memory structures, such as EPROM, EEPROM, and flash devices. In one form, the gate dielectric layer 26a can be used to form a tunnel oxide which will typically require an oxide thickness of between 90–110 Angstroms. The dielectric layer 26(b) which is formed insitu to the layer 26a by the same furnace or thermal processing will function as a thicker gate oxide for logic devices on the nonvolatile device.

In yet another form, other memory devices such as static random access memory (SRAM) can benefit from transistors having differing gate oxide thickness. Therefore, the transistor in region 11 of FIG. 5 can be used as a pull-down or drive transistor of an SRAM cell whereby this transistor is coupled to a ground or VDD potential, whereas the transistor formed in region 13 of FIG. 5 can be formed as a pass transistor of an SRAM cell which couples to an SRAM word line. Also, in embedded controllers or microcontrollers one set of transistors (e.g. logic areas) may be built with the a first gate oxide thickness whereas other areas (e.g., memory arrays) may be made with other oxide thickness while using only the one uniform oxide growth environment.

In addition, the process taught herein is not only limited to gate oxide processing, but may be used for an inter-level dielectric (ILD), a capacitor dielectric, and the like. For example, in one form, the process taught herein can be used to make two polysilicon gate capacitors with two different capacitor dielectric thickness.

Furthermore, the process taught herein may be used to form a gate oxide or like oxide layer with three or more different thickness using three or more distinct substrate regions instead of the two regions 11 and 13 illustrated in FIGS. 1–5. This N-region process (N being a finite positive integer greater than or equal to three) is similar to FIGS. 1–5 and is not further illustrated herein since this process is simply splitting up FIGS. 1–5 into N regions and using roughly N–1 different resist layers 16 in a manner repetitive to FIGS. 1–2. In this N-region embodiment, many iterative masking techniques, as taught herein via region 16, are used to expose a first portion of a substrate to a plasma environment for a first time period at a first power. Another mask layer can then be formed to mask a second substrate portion to carbon incorporate a second substrate area for a second time period at a second plasma power. The second substrate are may include the first substrate portion thereby cumulatively carbon processing the first substrate portion, or the first and second substrate portions may be mutually exclusive of each other whereby each region receives a mutually exclusive and non-overlapping carbon process. Finally, a last region of a sacrificial oxide may be removed using wet etch processing as taught herein to form a carbon-free portion of the substrate. By exposing all of these regions comprising one or more f different cumulative or mutually-exclusive carbon environments, each of the N regions will differ in one or more of carbon profiles, carbon surface and bulk doping concentrations, or carbon region depths. Therefore, a single oxide growth environment will result in a three or more different oxide portions with three or more different oxide thickness due to the different carbon processing in each of the N areas. For example, a microcontroller could be made to contain a 110 Angstrom tunnel oxide, a 150 Angstrom logic gate oxide, and a 300 Angstrom high voltage gate oxide using the carbon-based processing taught herein via FIGS. 1–5.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, furnace oxidation can occur in the presence of $O_2$ along with a slight flow of HCl which will effect oxidation rates. Therefore, it is intended that this invention encompass all of the variations and modifications as fall within the scope of the appended claims.

What is claimed is:

1. A method for forming a semiconductor structure, the method comprising the steps of:

providing a substrate having a surface;

growing a sacrificial oxide on the surface of the substrate, the sacrificial oxide having a first portion and a second portion;

etching the sacrificial oxide from the first portion using a plasma etch process;

etching the sacrificial oxide from the second portion using a wet etch process; and growing a device oxide over the first and second portions after the steps of etching, the growing forming the device oxide so that a thickness of the device oxide over the first portion is different from a thickness of the device oxide over the second portion.

2. The method of claim 1 wherein the step of growing comprises:
  forming the device oxide so that the device oxide over the second portion is thicker than the device oxide over the first portion.

3. The method of claim 2 wherein the step of growing comprises:
  forming the device oxide so that the device oxide over the second portion is 1.5 to 3 times thicker than the device oxide over the first portion.

4. The method of claim 1 further comprising:
  forming a first transistor over the first portion of the device oxide; and
  forming a second transistor over the second portion of the device oxide,
  whereby the first and second transistors have different gains due to different gate oxide thickness.

5. The method of claim 1 wherein the step of etching using the wet etch process comprises:
  using a wet HF solution to etch the sacrificial oxide from the second portion of the substrate.

6. The method of claim 1 wherein the step of etching using the wet etch process comprises:
  using a wet BOE solution to etch the sacrificial oxide from the second portion of the substrate.

7. The method of claim 1 wherein the step of etching using the plasma etch process comprises:
  using a plasma comprising carbon and fluorine to etch the first portion of the sacrificial oxide.

8. The method of claim 7 wherein the step of etching using the plasma etch process comprises:
  incorporating carbon into the substrate surface to form a carbon-containing portion of the substrate whereby the carbon retards oxide growth on the surface of first portion of the substrate so that the device oxide in the first portion is thinner than the device oxide in the second portion.

9. The method of claim 8 wherein the step of etching using the plasma etch process comprises:
  incorporating nitrogen into the carbon-containing portion of the substrate to further retard device oxide growth in the first portion of the substrate.

10. The method of claim 1 wherein the step of etching using the plasma etch process comprises:
  using a plasma comprising carbon, fluorine, and nitrogen to etch the first portion of the sacrificial oxide wherein the plasma incorporates carbon and nitrogen into the first portion of the substrate whereby a combination of nitrogen and carbon in the first portion of the substrate retards device oxide growth.

11. The method of claim 1 wherein the steps of etching comprise:
  forming a photoresist layer to mask the second portion of the sacrificial oxide;
  etching the first portion of the sacrificial oxide using the plasma etch process while the photoresist layer protects the second portion of the sacrificial oxide from substantial etching;
  removing the photoresist layer; and
  exposing the first and second portions of the substrate to the wet etch process to remove the second portion of the sacrificial oxide.

12. The method of claim 1 further comprising:
  forming a first transistor using the first portion of the device oxide wherein the device oxide for the first transistor is a tunnel oxide; and
  forming a second transistor using the second portion of the device oxide wherein the device oxide for the second transistor is a non-tunneling gate oxide.

13. The method of claim 1 further comprising:
  forming a first transistor using the first portion of the device oxide wherein the first transistor is formed as part of a static random access memory (SRAM) cell; and
  forming a second transistor using the second portion of the device oxide wherein the second transistor is used to form a logic gate.

14. The method of claim 1 further comprising:
  forming a first transistor using the first portion of the device oxide wherein the first transistor is formed as a drive transistor of a static random access memory (SRAM) cell; and
  forming a second transistor using the second portion of the device oxide wherein the second transistor is a pass transistor of a static random access memory (SRAM) cell which is connected to a word line of the static random access memory (SRAM) cell.

15. A method for forming a semiconductor device, the method comprising the steps of:
  providing a substrate having a surface;
  growing a sacrificial oxide on the surface of the substrate at a temperature of 950° C.–1050° C., the sacrificial oxide having a first portion and a second portion different from the first portion;
  masking the second portion of the sacrificial oxide with a photoresist layer;
  etching the sacrificial oxide from the first portion using a plasma etch process where the plasma contains both fluorine and carbon and where the second portion of the sacrificial oxide is protected from substantial etching by the photoresist layer, the etching depositing carbon into the surface of the substrate under the first portion to form a carbon-containing region;
  removing the photoresist layer;
  etching the sacrificial oxide from the second portion using a wet etch process comprising fluorine;
  growing a gate oxide over the first and second portions after the step of etching, the carbon-containing region retarding oxide growth so that a thickness of the gate oxide over the first portion of the substrate is less than a thickness of the gate oxide over the second portion of the substrate;
  forming a first MOS transistor using the gate oxide over the first portion of the substrate; and
  forming a second MOS transistor using the gate oxide over the second portion of the substrate.

16. The method of claim 15 wherein the steps of forming the first and second MOS transistors comprise:
  forming the first MOS transistor as a drive transistor of a random access memory (RAM) cell; and
  forming the second MOS transistor as a pass transistor of the random access memory (RAM) cell.

17. The method of claim 15 wherein the steps of forming the first and second MOS transistors comprise:
  forming the first MOS transistor as a tunneling transistor of a floating gate non-volatile memory cell; and
  forming the second MOS transistor as another transistor of the floating gate non-volatile memory cell.

18. The method of claim 15 wherein the step of etching the sacrificial oxide from the first portion using a plasma etch process comprises:

providing nitrogen in a plasma environment of the plasma etch process so that nitrogen is also incorporated into the carbon-containing region to form a carbon/nitrogen-containing region.

19. The method of claim 15 wherein the step of etching the sacrificial oxide from the first portion using a plasma etch process comprises:

following the plasma etch process with a nitrogen exposure process so that nitrogen is also incorporated into the carbon-containing region to form a carbon/nitrogen-containing region.

20. The method of claim 19 wherein the step of etching the sacrificial oxide from the first portion using a plasma etch process comprises:

exposing the substrate to one or both of $N_2O$ or $NH_3$.

21. The method of claim 19 wherein the step of etching the sacrificial oxide from the first portion using a plasma etch process comprises:

ion implanting nitrogen into the surface of the substrate.

22. The method of claim 15 wherein the step of etching the sacrificial oxide from the first portion using a plasma etch process comprises:

exposing the sacrificial oxide to a plasma comprising $CF_4$, $CHF_3$, and an inert carrier gas.

23. The method of claim 15 wherein the step of etching the sacrificial oxide from the second portion using a wet etch process comprising fluorine comprises:

using one of either a buffered oxide etch (BOE) chemistry or HF acid as an active etchant in the wet etch process.

24. A method for forming a semiconductor device, the method comprising the steps of:

providing a semiconductive layer semiconductive layer; and using masking and carbon exposure processing to create N different regions of the surface of the semiconductive layer, N being a finite positive integer greater than two, each of the N different regions being carbon processed in a different manner whereby each of the N different regions will subsequently oxidize at a different rate at some point in time due to different carbon processing.

25. The method of claim 24 wherein the step of using comprises:

exposing two of the N different regions to a carbon environment for different time periods.

26. The method of claim 24 wherein the step of using comprises:

exposing two of the N different regions to a carbon plasma environment under different plasma power conditions.

27. The method of claim 24 wherein the step of using comprises:

forming at least two of the N different regions with a carbon-containing portion and one of the N different regions with no substantial carbon doping.

28. The method of claim 24 wherein the step of using comprises:

forming a first of the N different regions having a first carbon surface concentration; and forming a second of the N different regions having a second carbon surface concentration different from the first carbon surface concentration.

29. The method of claim 24 wherein the step of using comprises:

forming a first of the N different regions having a first carbon depth profile into substrate; and forming a second of the N different regions having a second carbon depth profile into substrate different from the first carbon depth profile into substrate.

30. The method of claim 24 wherein the step of using comprises:

etching a first sacrificial oxide portion off of one of the N different regions using a wet etch chemistry; and etching a second sacrificial oxide portion off of another of the N different regions using a carbon-based plasma environment.

* * * * *

UNITED STATES PATENT AND TRADEMARK OFFICE
CERTIFICATE OF CORRECTION

PATENT NO.    : 6,146,948
DATED         : November 14, 2000
INVENTOR(S)   : Wei Edwin Wu, Hsing-Huandg Tseng, Phillip Earl Crabtree, Yeong-Jyh Tom Lii It is certified that error appears in the above-identified patent and that said Letters Patent is hereby corrected as shown below:

<u>Column 9, claim 24,</u>
Line 33, after "providing a semiconductor layer"; delete the next occurrence of "semiconductor layer"; and insert -- having a surface --

Signed and Sealed this

Second Day of April, 2002

Attest:

JAMES E. ROGAN
Attesting Officer        Director of the United States Patent and Trademark Office